(12) United States Patent
Miyao et al.

(10) Patent No.: US 9,769,934 B2
(45) Date of Patent: Sep. 19, 2017

(54) PACKAGE BASE, PACKAGE, ELECTRONIC DEVICE, ELECTRONIC APPARATUS, AND MOVING OBJECT

(71) Applicant: Seiko Epson Corporation, Tokyo (JP)

(72) Inventors: Tetsuro Miyao, Suwa (JP); Hideki Ishigami, Hachinohe (JP); Yukihiko Shiohara, Hachinohe (JP); Tetsuya Otsuki, Fujimi (JP); Hidefumi Nakamura, Hachinohe (JP)

(73) Assignee: Seiko Epson Corporation (JP)

( * ) Notice: Subject to any disclaimer, the term of this patent is extended or adjusted under 35 U.S.C. 154(b) by 120 days.

(21) Appl. No.: 14/798,859

(22) Filed: Jul. 14, 2015

(65) Prior Publication Data
US 2016/0021752 A1 Jan. 21, 2016

(30) Foreign Application Priority Data

Jul. 16, 2014 (JP) ................. 2014-145667

(51) Int. Cl.
*B32B 3/10* (2006.01)
*H05K 3/34* (2006.01)
*H05K 1/03* (2006.01)

(52) U.S. Cl.
CPC ...... *H05K 3/3463* (2013.01); *H01L 2224/451* (2013.01); *H01L 2224/48091* (2013.01); *H01L 2224/48227* (2013.01); *H01L 2924/00014* (2013.01); *H05K 1/0306* (2013.01); *H05K 2201/10068* (2013.01); *H05K 2201/10083* (2013.01); *H05K 2201/10371* (2013.01); *H05K 2203/0435* (2013.01)

(58) Field of Classification Search
None
See application file for complete search history.

(56) References Cited

U.S. PATENT DOCUMENTS

2001/0024416 A1    9/2001  Aoyama et al.
2015/0342072 A1*  11/2015  Nishina .................. B23K 35/30
                                                                277/630

FOREIGN PATENT DOCUMENTS

| JP | H06-172051 A | 6/1994 |
| JP | H07-154073 A | 6/1995 |
| JP | 08-046325 | 2/1996 |
| JP | 11343179 A1 * | 12/1999 |
| JP | 2001-230548 A | 8/2001 |
| JP | 2003-046013 A | 2/2003 |
| JP | 2009-159195 A | 7/2009 |
| JP | WO 2013183315 A1 * | 12/2013 |

OTHER PUBLICATIONS

Machine Translation of JP11-343179 Retrieved Jan. 5, 2017.*

* cited by examiner

*Primary Examiner* — Christopher Polley
(74) *Attorney, Agent, or Firm* — Harness, Dickey & Pierce, P.L.C.

(57) ABSTRACT

A package base includes a package base body and a bonding metal layer provided in a frame shape or a ring shape in plan view on the package base body, wherein the bonding metal layer contains a Ti—Ag—Cu-containing alloy and a metal belonging to Group 6 in the periodic table.

12 Claims, 8 Drawing Sheets

| | Blending ratio in bonding metal layer 21b (wt%) | | Evaluation results | | | |
|---|---|---|---|---|---|---|
| | | | Evaluation of appearance | | Evaluation of airtightness | |
| | A | B | Wettability to package base body 21a | Shape retention property | CI value of quartz crystal vibrating piece 10 (kΩ) | |
| Example 1 (related art example) | 100 | 0 | ○ | × | 50 → | ○ |
| Example 2 | 90 | 10 | ○ | △ | 50 → | ○ |
| Example 3 | 80 | 20 | ○ | △ | 50 → | ○ |
| Example 4 | 75 | 25 | ○ | ○ | 50 → | ○ |
| Example 5 | 70 | 30 | ○ | ○ | 50 → | ○ |
| Example 6 | 65 | 35 | ○ | ○ | 50 → | ○ |
| Example 7 | 60 | 40 | △ | ○ | 480 → | × |
| Example 8 | 50 | 50 | × | ○ | 480 → | × |
| Example 9 | 40 | 60 | × | ○ | 480 → | × |
| Example 10 | 30 | 70 | × | ○ | 480 → | × |
| Example 11 | 20 | 80 | × | ○ | 480 → | × |
| Example 12 | 10 | 90 | × | ○ | 480 → | × |

FIG. 3

PACKAGE BASE, PACKAGE, ELECTRONIC DEVICE, ELECTRONIC APPARATUS, AND MOVING OBJECT

BACKGROUND

1. Technical Field

The present invention relates to a package base, a package, an electronic device including this package, and an electronic apparatus and a moving object including this electronic device.

2. Related Art

As a technique concerning bonding of a ceramic substrate relevant to a package base serving as a main body part of a package which is a constituent element of an electronic device and houses an electronic component, there has been known a production method, in which a bonding paste containing an active metal-containing brazing filler metal is applied onto a ceramic substrate, the ceramic substrate and a metal plate are placed in a stacked manner, and thereafter, both members are bonded to each other by a heat treatment, and then, an unnecessary portion of the metal plate is removed by an etching treatment, whereby a ceramic wiring board having a desired wiring pattern is obtained (see, for example, JP-A-8-46325).

In the ceramic wiring board produced by the above production method, as the bonding paste containing an active metal-containing brazing filler metal, specifically, a bonding paste containing a Ti—Ag—Cu alloy obtained by blending Ti (titanium) which is an active metal in a metal having an Ag (silver)-Cu (copper) eutectic composition is used.

It is believed that according to this, in the ceramic wiring board, the bonding strength between the ceramic substrate and a metal plate is improved, and thus, excellent thermal shock resistance and high reliability are obtained.

When the above bonding paste is applied to, for example, a package (container) to be used for an electronic device or the like, it is necessary to bond a ceramic substrate (corresponding to a package base) and a metal plate (corresponding to a lid) to each other with a gap in the thickness direction through the bonding paste applied in a frame shape in plan view and to form an internal space for housing an electronic component or the like between the ceramic substrate and the metal plate.

However, the above bonding paste has relatively high fluidity, and therefore has a problem that it easily spreads to the periphery even if it is applied in a predetermined shape, and lacks a shape retention property for retaining the predetermined shape (in other words, the ratio of the height relative to the application width is small).

As a result, in the case of a package using the above bonding paste, in order to ensure the height of the internal space, when the bonding paste is applied, a reasonable application space including a space where the paste may spread is needed, and therefore, it may be difficult to further reduce the size.

SUMMARY

An advantage of some aspects of the invention is to solve at least a part of the problems described above, and the invention can be implemented as the following forms or application examples.

Application Example 1

This application example is directed to a package base including: a substrate containing a ceramic; and a bonding metal layer provided in a frame shape or a ring shape in plan view on the substrate, wherein the bonding metal layer contains a Ti—Ag—Cu-containing alloy and a metal belonging to Group 6 in the periodic table.

According to this application example, the package base is configured such that the bonding metal layer (corresponding to a bonding paste) contains a Ti—Ag—Cu-containing alloy and a metal belonging to Group 6 in the periodic table, and therefore, by the physical properties of the metal belonging to Group 6, the shape retention property of the bonding metal layer can be improved.

As a result, in the package base, the application width of the bonding metal layer can be decreased as compared with the configuration of the related art (for example, JP-A-8-46325), and thus, the planar size thereof can be reduced by that much. Accordingly, the package base can contribute to further reduction in the size of a package.

Application Example 2

In the package base according to the application example described above, it is preferred that the bonding metal layer contains Mo or W as the metal belonging to Group 6.

According to this application example, the package base is configured such that the bonding metal layer contains Mo (molybdenum) or W (tungsten) as the metal belonging to Group 6, and therefore, by the physical properties of Mo or W having a higher melting point than Ti, Ag, and Cu, the shape retention property of the bonding metal layer can be further improved.

Application Example 3

In the package base according to the application example described above, it is preferred that the package base further includes a metal coating film covering at least a part of the surface of the bonding metal layer.

According to this application example, the package base includes a metal coating film covering at least a part of the surface of the bonding metal layer, and therefore, oxidation of the bonding metal layer is suppressed, and the bonding strength between the substrate and a bonding target member to be bonded to each other through the bonding metal layer can be improved.

Application Example 4

In the package base according to the application example described above, it is preferred that the metal coating film includes a Ni film and a Au film which are stacked in this order from the bonding metal layer side.

According to this application example, the package base is configured such that the metal coating film includes a Ni film and a Au film which are stacked in this order from the bonding metal layer side, and therefore, the metal coating film closely adheres to the bonding metal layer so that oxidation of the bonding metal layer can be reliably suppressed.

Application Example 5

This application example is directed to a package including: a substrate containing a ceramic; a lid covering one side of the substrate; and a bonding metal layer provided in a frame shape or a ring shape in plan view and bonding the substrate and the lid to each other to form an internal space, wherein the bonding metal layer contains Ti, Ag, Cu and a metal belonging to Group 6 in the periodic table.

According to this application example, the package is configured such that the bonding metal layer contains a Ti—Ag—Cu-containing alloy and a metal belonging to Group 6 in the periodic table, and therefore, by the physical properties of the metal belonging to Group 6, the shape retention property of the bonding metal layer can be improved.

As a result, in the package, the application width of the bonding metal layer can be decreased as compared with the configuration of the related art (for example, JP-A-8-46325) when forming an internal space, and thus, the planar size thereof can be reduced by that much. Accordingly, the size thereof can be further reduced.

Application Example 6

In the package according to the application example described above, it is preferred that the bonding metal layer contains Mo or W as the metal belonging to Group 6.

According to this application example, the package is configured such that the bonding metal layer contains Mo or W as the metal belonging to Group 6, and therefore, by the physical properties of Mo or W having a higher melting point than Ti, Ag, and Cu, the shape retention property of the bonding metal layer can be further improved.

Application Example 7

In the package according to the application example described above, it is preferred that in the bonding metal layer, when the amount of Ti, Ag, and Cu is represented by A wt % and the amount of Mo is represented by B wt %, the ratio of A to B satisfies the following relational formula: $65 \leq A < 100 : 35 \geq B > 0$ (provided that $A+B=100$).

According to this application example, the package is configured such that in the bonding metal layer, when the amount of Ti, Ag, and Cu is represented by A wt % and the amount of Mo is represented by B wt %, the ratio of A to B satisfies the following relational formula: $65 \leq A < 100 : 35 \geq B > 0$ (provided that $A+B=100$), and therefore, the shape retention property of the bonding metal layer can be improved while maintaining the wettability thereof to the substrate due to the blending ratio of Mo.

Application Example 8

In the package according to the application example described above, it is preferred that in the bonding metal layer, when the amount of Ti, Ag, and Cu is represented by A wt % and the amount of Mo is represented by B wt %, the ratio of A to B satisfies the following relational formula: $65 \leq A \leq 75 : 35 \geq B \geq 25$ (provided that $A+B=100$).

According to this application example, the package is configured such that in the bonding metal layer, when the amount of Ti, Ag, and Cu is represented by A wt % and the amount of Mo is represented by B wt %, the ratio of A to B satisfies the following relational formula: $65 \leq A \leq 75 : 35 \geq B \geq 25$ (provided that $A+B=100$), and therefore, the shape retention property of the bonding metal layer can be further improved while maintaining the wettability thereof to the substrate due to the blending ratio of Mo.

Application Example 9

In the package according to the application example described above, it is preferred that the package further includes a metal coating film covering at least a part of the bonding metal layer.

According to this application example, the package includes a metal coating film covering at least a part of the bonding face between the bonding metal layer and the lid, and therefore, oxidation of the bonding metal layer is suppressed, and the bonding strength between the substrate and the lid to be bonded to each other through the bonding metal layer can be improved.

Application Example 10

In the package according to the application example described above, it is preferred that the metal coating film includes a Ni film and a Au film which are stacked in this order from the bonding metal layer side.

According to this application example, the package is configured such that the metal coating film includes a Ni film and a Au film which are stacked in this order from the bonding metal layer side, and therefore, the metal coating film closely adheres to the bonding metal layer so that oxidation of the bonding metal layer can be reliably suppressed.

Application Example 11

In the package according to the application example described above, it is preferred that the substrate has a recess on the lid side.

According to this application example, the package is configured such that the substrate has a recess on the lid side, and therefore, for example, a housing target material such as an electronic component can be housed in the recess.

Accordingly, in the package, as the lid, a lid in a flat plate shape which is easily processed can be used.

Application Example 12

In the package according to the application example described above, it is preferred that the lid has a recess on the substrate side.

According to this application example, the package is configured such that the lid has a recess on the substrate side, and therefore, for example, a housing target material such as an electronic component can be housed in the recess.

Accordingly, in the package, as the substrate, a substrate in a flat plate shape which is easily processed can be used.

Further, in the case where the package is configured such that each of the substrate and the lid has a recess, for example, a housing target material such as an electronic component having a relatively large height can be housed across both recesses.

Application Example 13

This application example is directed to an electronic device including: the package according to any one of the application examples described above; and an electronic component, wherein the electronic component is housed in the internal space of the package.

According to this application example, the electronic device having this configuration is configured such that an electronic component is housed in the internal space of the package having a reduced size according to any one of the above application examples, and therefore, an electronic device having a reduced size can be provided.

Application Example 14

This application example is directed to an electronic apparatus including the electronic device according to the application example described above.

According to this application example, the electronic apparatus having this configuration includes the electronic device having a reduced size according to the above application example, and therefore, an electronic apparatus in which the size of a relevant component is reduced and the reliability is high can be provided.

Application Example 15

This application example is directed to a moving object including the electronic device according to the application example described above.

According to this application example, the moving object having this configuration includes the electronic device having a reduced size according to the above application example, and therefore, a moving object in which the size of a relevant component is reduced and the reliability is high can be provided.

BRIEF DESCRIPTION OF THE DRAWINGS

The invention will be described with reference to the accompanying drawings, wherein like numbers reference like elements.

FIG. 1A is a plan view seen from a lid side, and FIG. 1B is a cross-sectional view taken along the line A-A of FIG. 1A.

FIG. 3 is a table showing the relationship between the blending ratio of a Ti—Ag—Cu-containing alloy to Mo in a bonding metal layer and evaluation results.

FIG. 5A is a plan view seen from a lid side, and FIG. 5B is a cross-sectional view taken along the line A-A of FIG. 5A.

FIG. 6A is a plan view seen from a lid side, and FIG. 6B is a cross-sectional view taken along the line A-A of FIG. 6A.

FIG. 7A is a plan view seen from a lid side, and FIG. 7B is a cross-sectional view taken along the line A-A of FIG. 7A.

DESCRIPTION OF EXEMPLARY EMBODIMENTS

Hereinafter, embodiments embodying the invention will be described with reference to the drawings.

First Embodiment

First, a quartz crystal resonator will be described as an example of an electronic device.

Figure 1A:
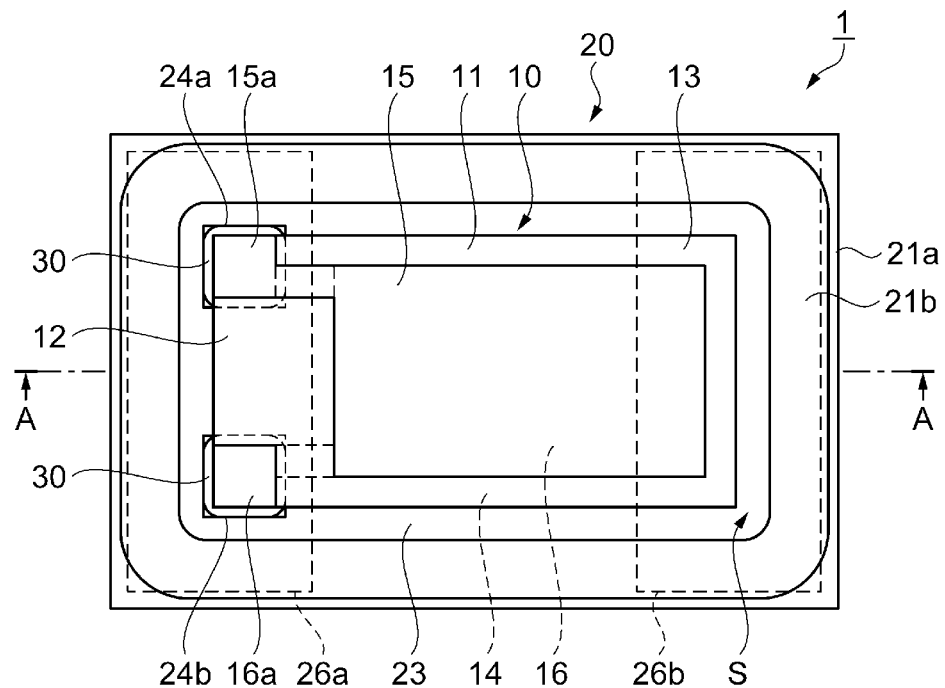
FIGS. 1A and 1B are schematic views each showing an outline structure of a quartz crystal resonator of a first embodiment.
Figure 1B:
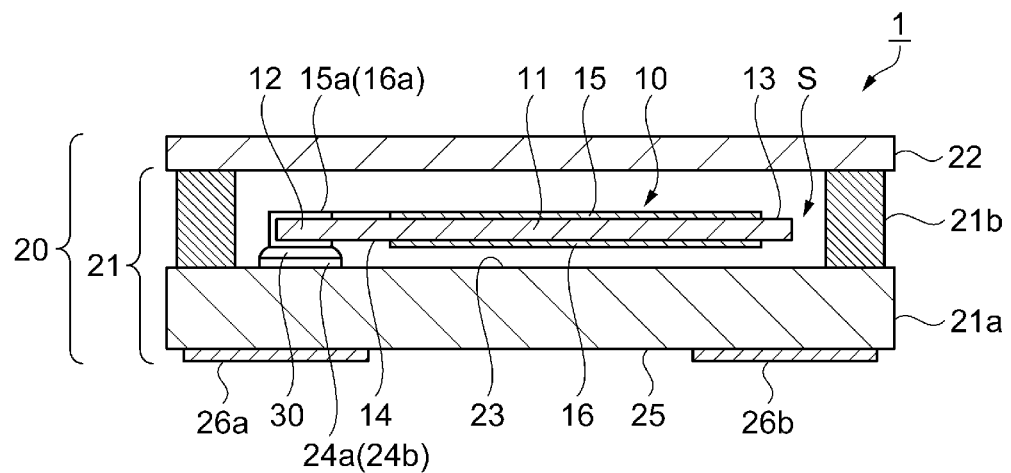
Figure 2:
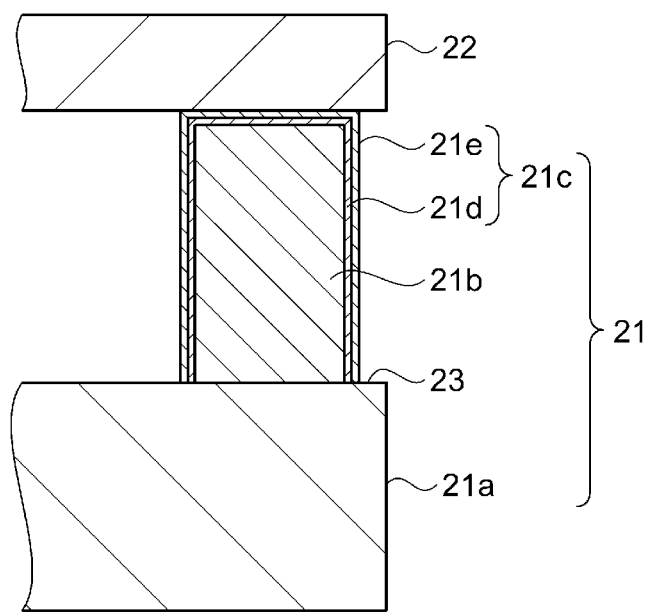
FIG. 2 is an enlarged view of a main part of FIG. 1B.

FIGS. 1A and 1B are schematic views each showing an outline structure of a quartz crystal resonator of a first embodiment. FIG. 1A is a plan view seen from a lid side, and FIG. 1B is a cross-sectional view taken along the line A-A of FIG. 1A. FIG. 2 is an enlarged view of a main part of FIG. 1B. It is noted that, hereinafter, in the plan views seen from the lid side including FIG. 1A, the lid is omitted. Further, in order to facilitate the understanding, the dimensions and ratios of the respective constituent elements are different from the actual ones.

As shown in FIGS. 1A and 1B, a quartz crystal resonator 1 includes a quartz crystal resonator element 10 as an electronic component, and a package 20 housing the quartz crystal resonator element 10 in an internal space S, and is formed into a flat and approximately rectangular shape.

The quartz crystal resonator element 10 is, for example, configured to integrally include a vibrating section 11, which is an AT-cut type in a flat plate shape cut out at a predetermined angle from quartz crystal ore or the like, has an approximately rectangular planar shape, and is excited to undergo thickness shear vibration, and a base section 12 which is connected to the vibrating section 11.

In the quartz crystal resonator element 10, extraction electrodes 15a and 16a extracted from approximately rectangular excitation electrodes 15 and 16, respectively, formed on one main surface 13 and the other main surface 14 of the vibrating section 11, respectively, are formed on the base section 12.

The extraction electrode 15a is extracted from the excitation electrode 15 on the one main surface 13 to the base section 12 along the longitudinal direction (the lateral direction in the drawing) of the quartz crystal resonator element 10, goes around the other main surface 14 along the side surface of the base section 12, and extends to the vicinity of the excitation electrode 16 on the other main surface 14.

The extraction electrode 16a is extracted from the excitation electrode 16 on the other main surface 14 to the base section 12 along the longitudinal direction of the quartz crystal resonator element 10, goes around the one main surface 13 along the side surface of the base section 12, and extends to the vicinity of the excitation electrode 15 on the one main surface 13.

The excitation electrodes 15 and 16 and the extraction electrodes 15a and 16a are each, for example, a metal coating film having a structure in which Cr (chromium) is used as a foundation layer, and a layer of Au (gold) is stacked thereon.

The package 20 includes a package base body 21a serving as a substrate having an approximately rectangular planar shape and containing a ceramic, a lid 22 in an approximately rectangular plate shape as a lid covering one side of the package base body 21a, and a bonding metal layer 21b provided in a frame shape or a ring shape in plan view and bonding the package base body and the lid to each other to form an internal space S.

In the package 20, a package base 21 is configured to include the package base body 21a and the bonding metal layer 21b.

In the package base body 21a, a ceramic-based insulating material such as an aluminum oxide sintered body, a mullite sintered body, an aluminum nitride sintered body, a silicon carbide sintered body, or a glass ceramic sintered body obtained by molding a ceramic green sheet and firing the resulting molded body is used.

The bonding metal layer 21b contains a Ti—Ag—Cu-containing alloy and a metal belonging to Group 6 in the periodic table. Specifically, a Ti—Ag—Cu-containing alloy and an alloy containing Mo or W as the metal belonging to Group 6 are used.

To be more specific, the bonding metal layer 21b is configured such that when the amount of the Ti—Ag—Cu-containing alloy (i.e. the amount of Ti, Ag, and Cu) is represented by A wt % and the amount of Mo is represented by B wt %, the ratio of A to B preferably satisfies the following relational formula: $65 \leq A < 100 : 35 \geq B > 0$ (provided that A+B=100), more preferably satisfies the following relational formula: $65 \leq A \leq 75 : 35 \geq B \geq 25$ (provided that A+B=100) (which will be described in detail below).

As an example, the bonding metal layer 21b is first formed into a paste by blending a powder (an average particle diameter of about 5 μm) of Mo in an amount satisfying the above wt % ratio in a powder (an average particle diameter of about 30 μm) of an alloy containing 2 wt % of Ti, 71 wt % of Ag, and 27 wt % (remainder) of Cu, and mixing an appropriate amount (about 20 wt % as an example) of an organic vehicle as a binder therein.

The thus prepared bonding metal layer 21b in a paste form is screen-printed on one side of the package base body 21a using a metal mask or the like, followed by firing in a vacuum furnace. As an example, the firing conditions are preferably set as follows: vacuum degree: $1.33 \times 10^{-3}$ Pa or less (no replacement gas), firing temperature: 400° C. for 1 hour+900° C. for 1 hour (a two-step treatment), temperature rising speed: 200° C./hour, and temperature falling speed: 50° C./hour.

Further, as shown in FIG. 2, the package base 21 preferably includes a metal coating film 21c covering at least a part (the entire surface in FIG. 2) of an exposed surface (in other words, a surface or a bonding face with the lid 22) of the bonding metal layer 21b after firing. In this metal coating film 21c, it is preferred that a Ni (nickel) film 21d and a Au film 21e are stacked in this order from the bonding metal layer 21b side.

The Ni film 21d and the Au film 21e are formed by, for example, an electroless plating method, and the film thickness of the Ni film 21d is preferably 2 μm or more, and the film thickness of the Au film 21e is preferably 0.03 μm or more.

For the lid 22, a metal having a thermal expansion coefficient at around normal temperature close to that of the package base body 21a such as Kovar (an Fe (iron)-Ni—Co (cobalt) alloy) or a 42 alloy (an Fe—Ni alloy) is used for decreasing a difference in thermal expansion from the package base body 21a accompanying a change in ambient temperature.

On a first main surface 23 which is a main surface of one side (the lid 22 side) of the package base body 21a, internal terminals 24a and 24b are provided at positions facing the extraction electrodes 15a and 16a of the quartz crystal resonator element 10, respectively.

In the quartz crystal resonator element 10, the extraction electrodes 15a and 16a are bonded to the internal terminals 24a and 24b, respectively, through a conductive adhesive 30 such as an epoxy-based, a silicone-based, or a polyimide-based adhesive mixed with a conductive material such as a metal filler.

In the quartz crystal resonator 1, one side (the first main surface 23 side) of the package base body 21a is covered with the lid 22 in a state where the quartz crystal resonator element 10 is bonded to the internal terminals 24a and 24b of the package base body 21a, and the bonding metal layer 21b of the package base 21 and the lid 22 are seam-welded (resistance-welded), whereby the internal space S of the package 20 is hermetically sealed.

The hermetically sealed internal space S of the package 20 is in a vacuum state (a state in which the vacuum degree is high) in which the pressure is reduced, or a state in which an inert gas such as nitrogen, helium, or argon is filled.

In both end portions in the longitudinal direction (the lateral direction in the drawing) of a second main surface 25 which is a main surface on the opposite side from the one side (the first main surface 23 side) of the package base body 21a, rectangular electrode terminals 26a and 26b are provided, respectively.

The electrode terminals 26a and 26b are electrically connected to the internal terminals 24a and 24b, respectively, bonded to the extraction electrodes 15a and 16a of the quartz crystal resonator element 10 through internal wirings (not shown). Specifically, for example, the electrode terminal 26a is electrically connected to the internal terminal 24a, and the electrode terminal 26b is electrically connected to the internal terminal 24b.

The internal terminals 24a and 24b and the electrode terminals 26a and 26b of the package base body 21a are each composed of, for example, a metal coating film layer in which each coating film of Ni, Au, or the like is stacked by plating or the like on a metallized layer of W, Mo, or the like. In this metal coating film layer, the same material as that of the bonding metal layer 21b may be used.

The quartz crystal resonator 1 may be configured such that an electrode terminal is placed at each of the four corners on the second main surface 25 side of the package base body 21a, and one pair of the diagonally facing electrode terminals are defined as electrode terminals 26a and 26b, and the other pair of the diagonally facing electrode terminals are connected to the bonding metal layer 21b and may be used as GND terminals (grounding terminals).

In the quartz crystal resonator 1, for example, by a driving signal to be applied through the electrode terminals 26a and 26b from an oscillation circuit integrated in an IC chip of an electronic apparatus, the quartz crystal resonator element 10 is excited to undergo thickness shear vibration and resonates (oscillates) at a predetermined frequency, and outputs a resonance signal (oscillation signal) from the electrode terminals 26a and 26b.

Here, evaluation results with respect to the blending ratio of the Ti—Ag—Cu-containing alloy to Mo in the bonding metal layer 21b of the package base 21 will be described.

Figure 4:
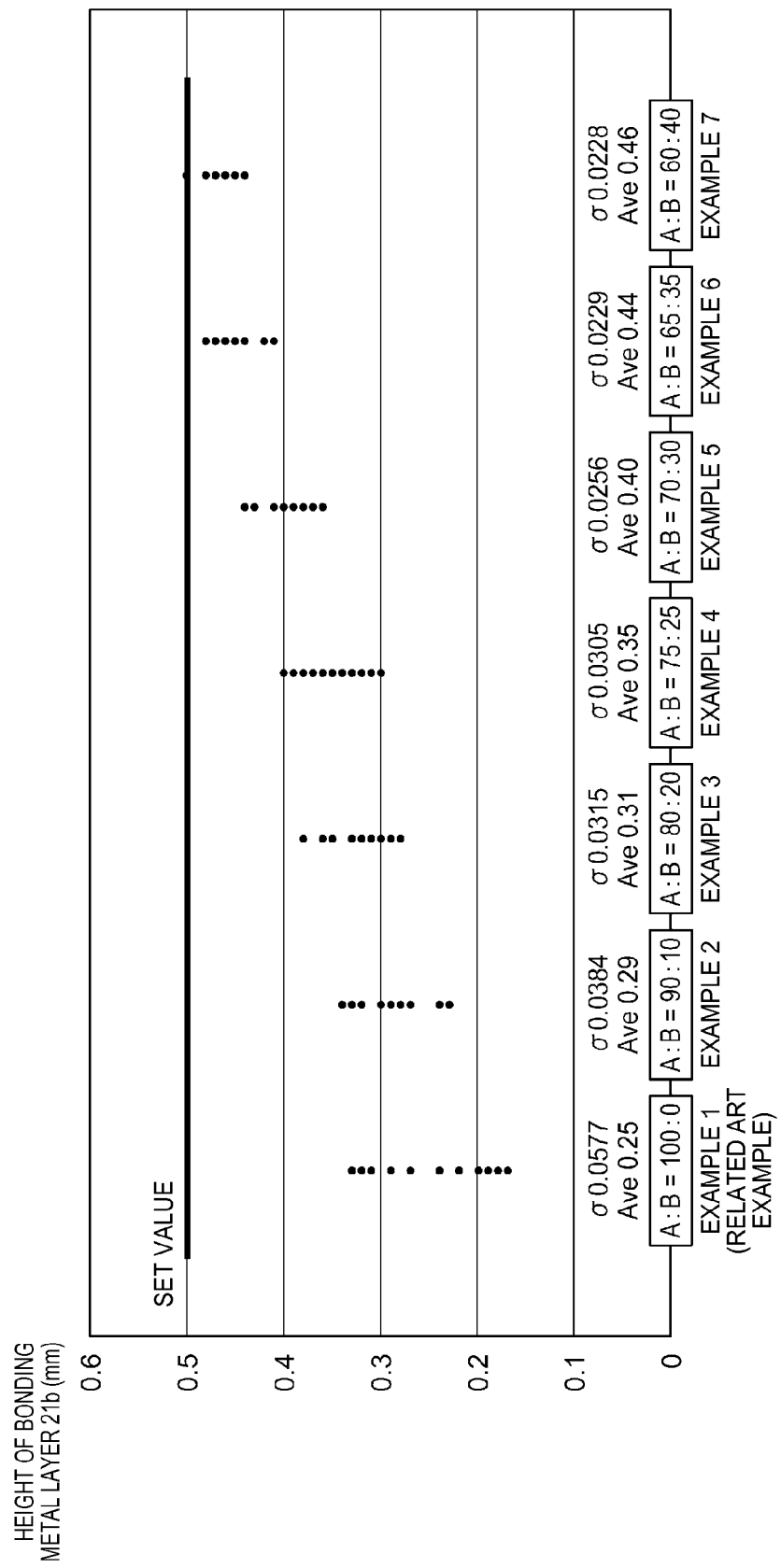
FIG. 4 is a graph showing detailed measurement results with respect to the shape retention property (particularly height) of FIG. 3.

FIG. 3 is a table showing the relationship between the blending ratio of the Ti—Ag—Cu-containing alloy to Mo in the bonding metal layer and evaluation results. FIG. 4 is a graph showing detailed measurement results with respect to the shape retention property (particularly height) among the evaluation results. The abscissa represents respective Examples (1 to 7), and the ordinate represents the height (mm of the bonding metal layer after firing in each Example.

In Examples 1 to 12, the above-described quartz crystal resonator 1 was used, and only the blending ratio of the Ti—Ag—Cu-containing alloy to Mo in the bonding metal layer 21b was changed. Here, the amount of the Ti—Ag—Cu-containing alloy is represented by A (wt %), and the amount of Mo is represented by B (wt %).

With respect to the quartz crystal resonator 1 of each of Examples 1 to 12, the following evaluation was performed. Incidentally, depending on the evaluation items, evaluation was performed for the package base 21 alone.

Evaluation of Wettability to Package Base Body 21a (Evaluation of Appearance)

The wettability of the bonding metal layer 21b applied to the package base body 21a was observed using an electron microscope (SEM) or the like before and after firing, and evaluation was performed at the following three levels: A: good, B: moderate, C: poor.

Evaluation of Shape Retention Property (Evaluation of Appearance)

The shape (height, expansion of width), the presence or absence of a crack, and the like after firing the bonding metal layer 21b applied to the package base body 21a were observed using an electron microscope or the like (for some test subjects, the height was measured as shown in FIG. 4), and evaluation was performed at the following three levels: A: good, B: moderate, C: poor.

Evaluation of Airtightness

The CI (crystal impedance) value of the quartz crystal resonator element 10 was measured as an alternative characteristic (the airtightness is lower as the CI value is higher), and the airtightness of the internal space S in the quartz crystal resonator 1 was evaluated at the following three levels: A: good, B: moderate, C: poor.

Evaluation Results

The evaluation results based on the above evaluation items are shown in FIGS. 3 and 4.

As shown in FIGS. 3 and 4, in the case of Example (related art example) in which Mo is not contained, the wettability to the package base body 21a is good (A), however, the height of the bonding metal layer 21b is 0.25 mm on average with respect to a set value of 0.5 mm, and is the smallest among the cases of Examples 1 to 7.

Further, in the case of Example 1, a variation σ (standard deviation) in the height of the bonding metal layer 21b is the largest among the cases of Examples 1 to 7, and moreover, there is also a test subject in which the height of the bonding metal layer 21b is much smaller than 0.2 mm (lower limit), and thus, it is found that the shape retention property is poor (C).

It is considered that this is because the bonding metal layer 21b does not contain Mo having a high melting point (about 2600° C.), so that there is no metal serving as a nucleus maintaining the shape of particles during firing and the layer easily flows as a whole, and thus, the height cannot be ensured.

On the other hand, in the cases of Examples 2 to 6 in which Mo is contained in an amount of 10 to 35 wt %, although some have a shape retention property evaluated as moderate (B), the height of the bonding metal layer 21b reliably exceeds 0.2 mm (lower limit), and the evaluation results are mostly good (A) including the other evaluation items.

In particular, in the cases of Examples 4 to 6 in which Mo is contained in an amount of 25 to 35 wt %, the evaluation results are good (A) with respect to all evaluation items of the wettability to the package base body 21a, the shape retention property, and the airtightness.

It is considered that this is because the bonding metal layer 21b contains an appropriate amount of Mo having a high melting point, so that the particles of Mo serve as nuclei and are stacked on one another during firing to ensure the height while ensuring the wettability to the package base body 21a due to Ti, and also due to affinity between Mo and Ti, the expansion in the width direction of the components of Ti—Ag—Cu-containing alloy is suppressed.

On the other hand, in the cases of Examples 7 to 12 in which Mo is contained in an amount of 40 to 90 wt %, although the shape retention property is good (A), the wettability to the package base body 21a is moderate (B) to poor (C), and therefore, the airtightness cannot be sufficiently ensured, and thus, the evaluation result of the airtightness is poor (C).

Incidentally, the same evaluation results as above have been obtained also by using W in place of Mo in the bonding metal layer 21b.

As described above, the quartz crystal resonator 1 of the first embodiment exhibits the following effects for each configuration category.

First, the package base 21 is configured such that the bonding metal layer 21b contains a Ti—Ag—Cu-containing alloy and a metal belonging to Group 6 in the periodic table, and therefore, by the physical properties of the metal belonging to Group 6, the shape retention property of the bonding metal layer 21b can be improved.

As a result, in the package base 21, the application width of the bonding metal layer 21b can be decreased as compared with the configuration of the related art (for example, JP-A-8-46325), and thus, the planar size thereof can be reduced by that much. Accordingly, the package base 21 can contribute to further reduction in the size of the package 20.

Further, the package base 21 is configured such that the bonding metal layer 21b contains Mo or W as the metal belonging to Group 6, and therefore, by the physical properties of Mo or W having a higher melting point than Ti, Ag, and Cu, the shape retention property of the bonding metal layer 21b can be further improved.

Further, the package base 21 includes the metal coating film 21c covering at least a part of the surface of the bonding metal layer 21b, and therefore, oxidation of the bonding metal layer 21b is suppressed, and the bonding strength between the package base body 21a and the lid 22 as a bonding target member to be bonded to each other through the bonding metal layer 21b can be improved.

Further, the package base 21 is configured such that the metal coating film 21c includes the Ni film 21d and the Au film 21e which are stacked in this order from the bonding metal layer 21b side, and therefore, the metal coating film 21c closely adheres to the bonding metal layer 21b so that oxidation of the bonding metal layer 21b can be reliably suppressed.

Next, the package 20 is configured such that the bonding metal layer 21b contains a Ti—Ag—Cu-containing alloy and a metal belonging to Group 6 in the periodic table, and therefore, by the physical properties of the metal belonging to Group 6, the shape retention property of the bonding metal layer 21b can be improved.

As a result, in the package 20, the application width of the bonding metal layer 21b can be decreased as compared with the configuration of the related art (for example, JP-A-8-46325) when forming the internal space S, and thus, the planar size thereof can be reduced by that much. Accordingly, the size thereof can be further reduced.

Further, the package 20 is configured such that the bonding metal layer 21b contains Mo or W as the metal belonging to Group 6, and therefore, by the physical properties of Mo or W having a higher melting point than Ti, Ag, and Cu, the shape retention property of the bonding metal layer 21b can be further improved.

Further, the package 20 is configured such that in the bonding metal layer 21b, when the amount of the Ti—Ag—Cu-containing alloy is represented by A wt % and the amount of Mo is represented by B wt %, the ratio of A to B satisfies the following relational formula: $65 \leq A < 100$: $35 \geq B > 0$ (provided that $A+B=100$), and therefore, the shape retention property of the bonding metal layer 21b can be improved while maintaining the wettability thereof to the package base body 21*a* due to the blending ratio of Mo.

Further, the package 20 is configured such that in the bonding metal layer 21*b*, when the amount of the Ti—Ag—Cu-containing alloy is represented by A wt % and the amount of Mo is represented by B wt %, the ratio of A to B satisfies the following relational formula: 65≤A≤75: 35≥B≥25 (provided that A+B=100), and therefore, the shape retention property of the bonding metal layer 21*b* can be further improved while maintaining the wettability thereof to the package base body 21*a* due to the blending ratio of Mo.

Further, the package 20 includes the metal coating film 21*c* covering at least a part of the bonding face between the bonding metal layer 21*b* and the lid 22, and therefore, oxidation of the bonding metal layer 21*b* is suppressed, and the bonding strength between the package base body 21*a* and the lid 22 to be bonded to each other through the bonding metal layer 21*b* can be improved.

Further, the package 20 is configured such that the metal coating film 21*c* includes the Ni film 21*d* and the Au film 21*e* which are stacked in this order from the bonding metal layer 21*b* side, and therefore, the metal coating film 21*c* closely adheres to the bonding metal layer 21*b* so that oxidation of the bonding metal layer 21*b* can be reliably suppressed.

Next, the quartz crystal resonator 1 is configured such that the quartz crystal resonator element 10 as an electronic component is housed in the internal space S of the package 20, and therefore, a quartz crystal resonator as an electronic device having a reduced size can be provided.

Second Embodiment

Next, another configuration of a quartz crystal resonator as an electronic device will be described.

Figure 5A:
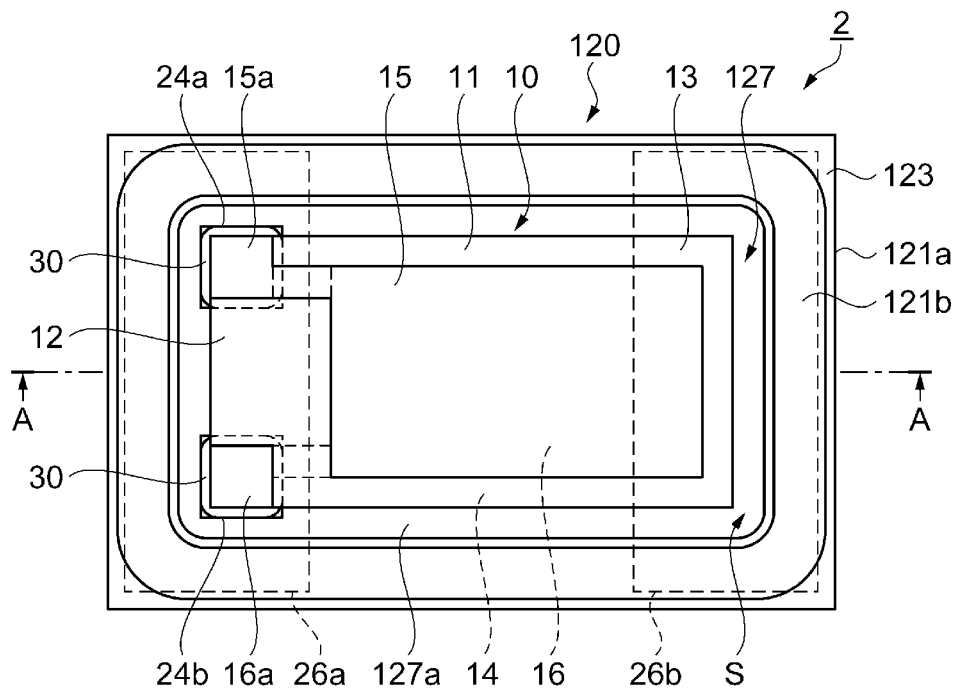
FIGS. 5A and 5B are schematic views each showing an outline structure of a quartz crystal resonator of a second embodiment.
Figure 5B:
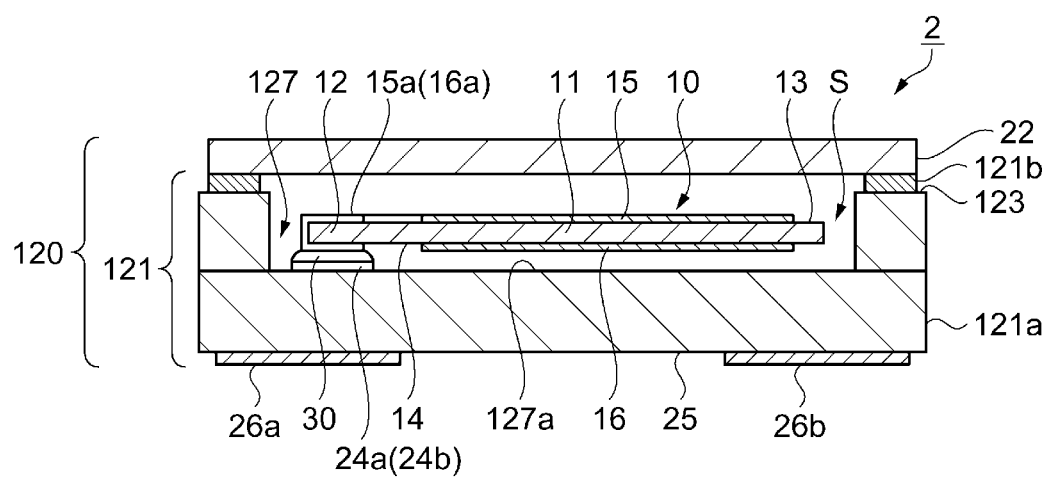

FIGS. 5A and 5B are schematic views each showing an outline structure of a quartz crystal resonator of a second embodiment. FIG. 5A is a plan view seen from a lid side, and FIG. 5B is a cross-sectional view taken along the line A-A of FIG. 5A.

The parts common to those in the first embodiment are denoted by the same reference numerals and a description thereof is omitted, and different parts from those of the first embodiment will be mainly described.

As shown in FIGS. 5A and 5B, a quartz crystal resonator 2 of the second embodiment is different in the configuration of the package from the first embodiment.

In a package 120 of the quartz crystal resonator 2, a package base body 121*a* of a package base 121 has a recess 127 on a lid 22 side (in other words, on a first main surface 123 side).

To be more specific, in the package 120, the package base body 121*a* has a two-layer structure and is configured such that on a first layer in a plate shape (a layer on which electrode terminals 26*a* and 26*b* are formed), a second layer in a rectangular frame shape is stacked.

According to this, in the package 120, the package base body 121*a* has the recess 127 on the lid 22 side.

On a bottom surface 127*a* of the recess 127, internal terminals 24*a* and 24*b* are provided, and to the internal terminals 24*a* and 24*b*, extraction electrodes 15*a* and 16*a* of a quartz crystal resonator element 10 are connected, respectively.

On a first main surface 123 of the second layer of the package base body 121*a*, a bonding metal layer 121*b* is provided in a frame shape along the planar shape of the first main surface 123. Here, the bonding metal layer 121*b* is applied in a range slightly narrower than the width of the first main surface 123 so as not to drip from the first main surface 123 and fired.

According to this, the package 120 of the quartz crystal resonator 2 is configured such that the package base body 121*a* has the recess 127 on the lid 22 side, and therefore, can reliably house the quartz crystal resonator element 10 in the recess 127 independent of the height of the bonding metal layer 121*b*.

Accordingly, in the package 120, as the lid 22, a lid in a flat plate shape which is easily processed can be used.

Further, in the package 120, the shape retention property of the bonding metal layer 121*b* is high, and therefore, the application width of the bonding metal layer 121*b* can be decreased as compared with the related art. Accordingly, in the package 120, the width of the first main surface 123 of the second layer of the package base body 121*a* (in other words, the width of the frame) can be decreased, and therefore, the planar size thereof can be reduced.

In the quartz crystal resonator 2, the quartz crystal resonator element 10 as an electronic component is housed in the internal space S of the package 120, and therefore, a quartz crystal resonator as an electronic device having a reduced size can be provided.

Third Embodiment

Next, still another configuration of a quartz crystal resonator as an electronic device will be described.

Figure 6A:
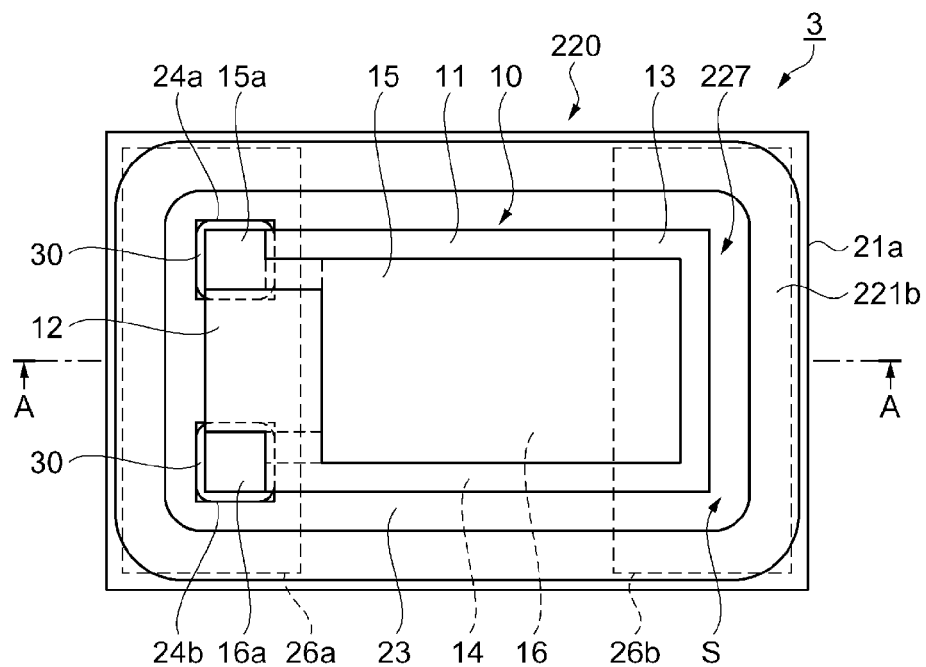
FIGS. 6A and 6B are schematic views each showing an outline structure of a quartz crystal resonator of a third embodiment.
Figure 6B:
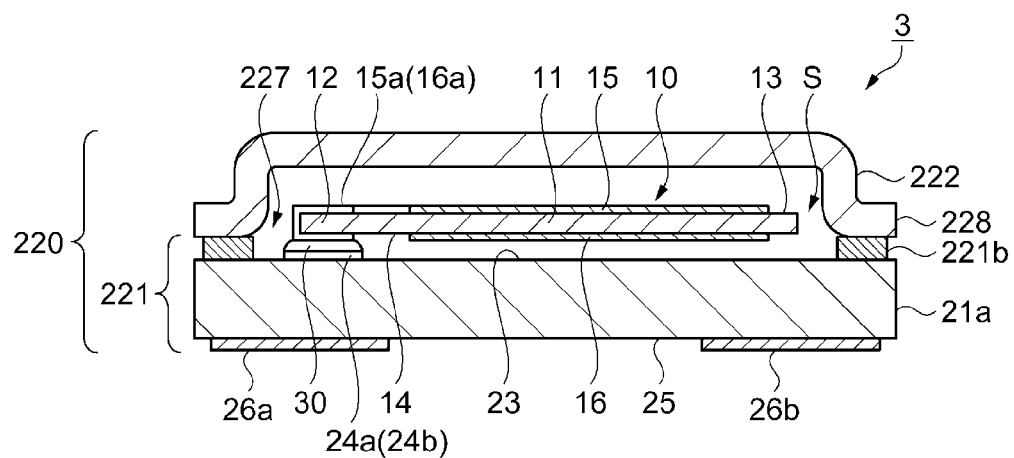

FIGS. 6A and 6B are schematic views each showing an outline structure of a quartz crystal resonator of a third embodiment. FIG. 6A is a plan view seen from a lid side, and FIG. 6B is a cross-sectional view taken along the line A-A of FIG. 6A.

The parts common to those in the first embodiment are denoted by the same reference numerals and a description thereof is omitted, and different parts from those of the first embodiment will be mainly described.

As shown in FIGS. 6A and 6B, a quartz crystal resonator 3 of the third embodiment is different in the configuration of the package from the first embodiment.

In a package 220 of the quartz crystal resonator 3, a lid 222 has a recess 227 on a package base body 21*a* side of a package base 221.

To be more specific, in the package 220, the lid 222 is formed into a cap shape having the recess 227 depressed toward the upper side in the drawing and a flange section 228 extending from the entire periphery of the recess 227 along a first main surface 23 of the package base body 21*a*.

A bonding metal layer 221*b* of the package base 221 is provided in a frame shape at a position facing the flange section 228 of the lid 222 on the first main surface 23 of the package base body 21*a*.

According to this, in the package 220 of the quartz crystal resonator 3, the lid 222 has the recess 227 on the package base body 21*a* side, and therefore, the quartz crystal resonator element 10 can be reliably housed in the recess 227 independent of the height of the bonding metal layer 221*b*.

Accordingly, in the package 220, as the package base body 21*a*, a package base body in a flat plate shape which is easily processed can be used.

Further, in the package 220, the shape retention property of the bonding metal layer 221*b* is high, and therefore, the application width of the bonding metal layer 221*b* can be decreased as compared with the related art. Accordingly, in the package 220, the width of the flange section 228 of the lid 222 can be decreased, and therefore, the planar size thereof can be reduced.

In the quartz crystal resonator 3, the quartz crystal resonator element 10 as an electronic component is housed in the internal space S of the package 220, and therefore, a quartz crystal resonator as an electronic device having a reduced size can be provided.

The above-described package may be configured such that each of the package base body and the lid has a recess. According to this, for example, a housing target material such as an electronic component having a relatively large height can be housed across both recesses.

Fourth Embodiment

Next, a quartz crystal oscillator will be described as an example of an electronic device.

Figure 7A:
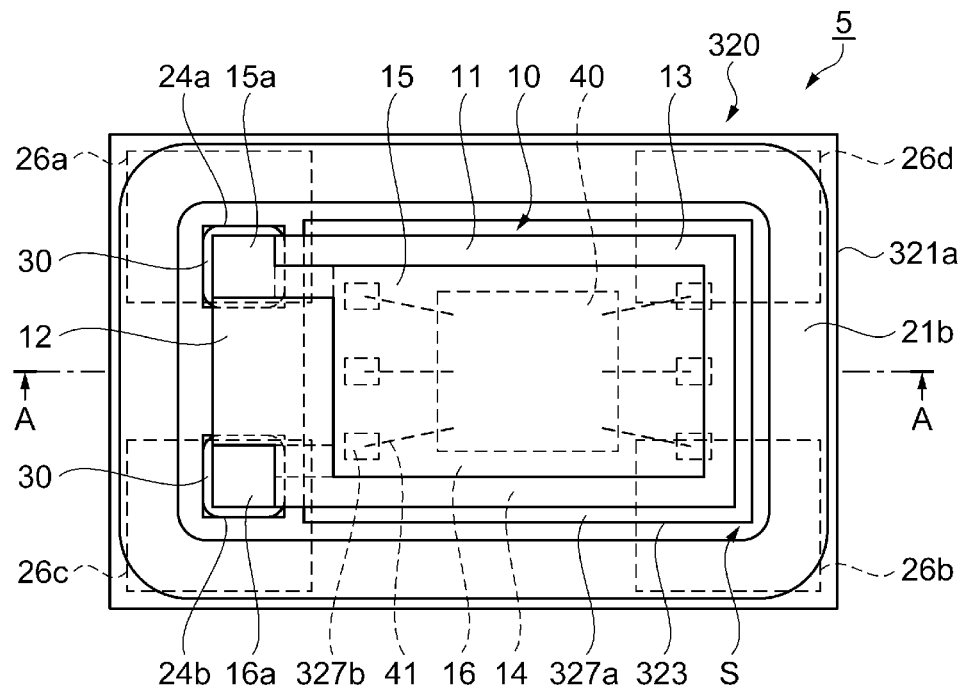
FIGS. 7A and 7B are schematic views each showing an outline structure of a quartz crystal oscillator of a fourth embodiment.
Figure 7B:
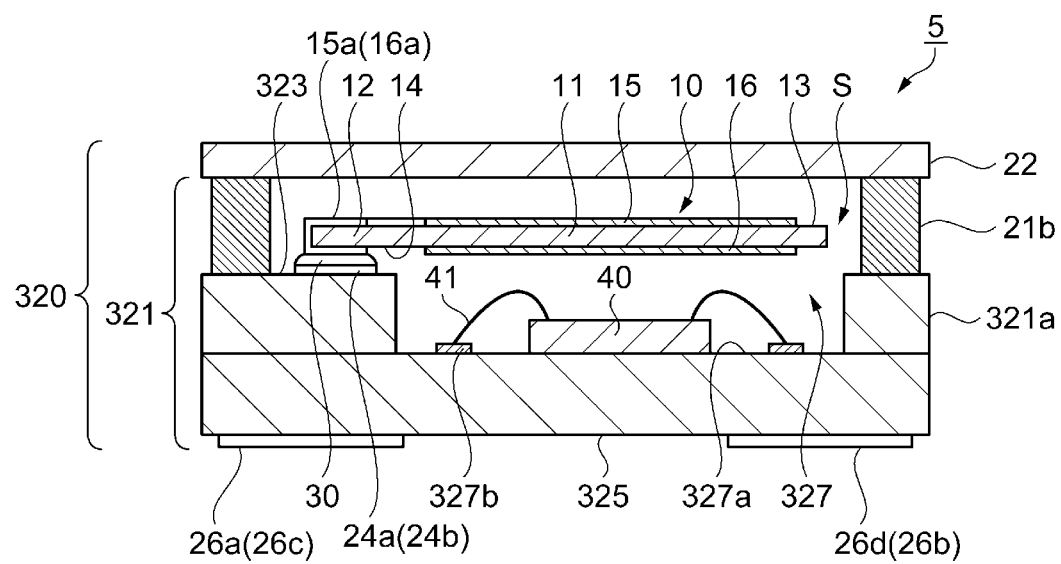

FIGS. 7A and 7B are schematic views each showing an outline structure of a quartz crystal oscillator of a fourth embodiment. FIG. 7A is a plan view seen from a lid side, and FIG. 7B is a cross-sectional view taken along the line A-A of FIG. 7A.

The parts common to those in the first embodiment are denoted by the same reference numerals and a description thereof is omitted, and different parts from those of the first embodiment will be mainly described.

As shown in FIGS. 7A and 7B, a quartz crystal oscillator 5 includes a package 320, a quartz crystal resonator element 10 as an electronic component, and also an IC chip 40 as an electronic component, and the quartz crystal resonator element 10 and the IC chip 40 are housed in an internal space S of the package 320.

To be more specific, in the package 320, a package base body 321a of a package base 321 has a two-layer structure, and a part (a part facing a vibrating section 11) of a second layer (a layer on the upper side in the drawing) in which the quartz crystal resonator element 10 is placed is opened in a rectangular shape so that a first layer (a layer on the lower side in the drawing) is exposed, whereby a recess 327 is formed. On a bottom surface 327a of the recess 327, multiple internal connection terminals 327b are provided.

The internal connection terminals 327b are connected to internal terminals 24a and 24b provided on a first main surface 323 and electrode terminals 26a to 26d provided at the four corners of a second main surface 325, respectively, through internal wirings (not shown).

The internal connection terminals 327b are each composed of, for example, a metal coating film layer in which each coating film of Ni, Au, or the like is stacked by plating or the like on a metallized layer of W, Mo, or the like. In this metal coating film layer, the same material as that of a bonding metal layer 21b may be used.

The IC chip 40 incorporating an oscillation circuit is fixed to the bottom surface 327a of the recess 327 with an adhesive or the like (not shown), and a connection pad (not shown) is connected to the internal connection terminals 327b through metal wires 41.

For the connection between the IC chip 40 and the internal connection terminals 327b, in addition to a connection method by wire bonding described above, a connection method using flip chip mounting with bumps by reversing the IC chip 40 may be used.

In the quartz crystal oscillator 5, a driving signal is output from the oscillation circuit of the IC chip 40 by an external input, and the quartz crystal resonator element is excited to undergo thickness shear vibration and resonates (oscillates) at a predetermined frequency, amplifies a resonance signal (oscillation signal) thereof, and then, outputs the signal from, for example, the electrode terminals 26a and 26b.

As described above, in the quartz crystal oscillator 5, the shape retention property of the bonding metal layer 21b is high, and therefore, in the package 320 having a reduced planar size, the quartz crystal resonator element 10 and the IC chip 40 as electronic components, are housed in the internal space S of the package 320.

Accordingly, the quartz crystal oscillator 5 can provide a quartz crystal oscillator as an electronic device having a reduced size.

Electronic Apparatus

Next, a cellular phone will be described as an example of an electronic apparatus including the above-described electronic device.

Figure 8:
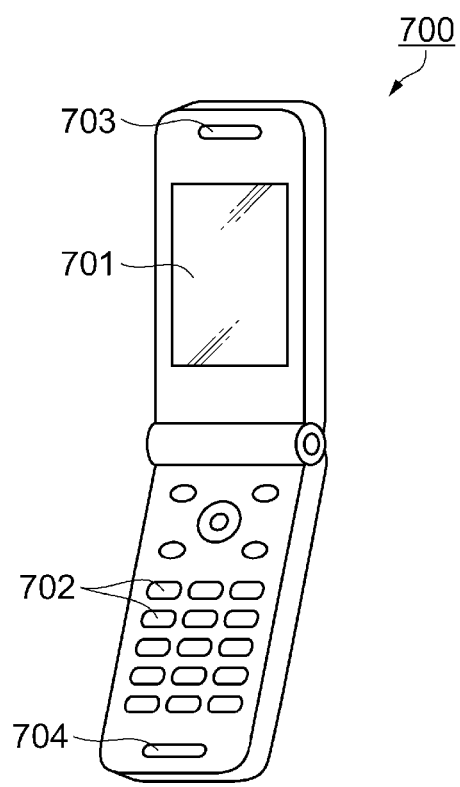
FIG. 8 is a schematic perspective view showing a cellular phone as an electronic apparatus.

FIG. 8 is a schematic perspective view showing a cellular phone as an electronic apparatus.

A cellular phone 700 includes a quartz crystal resonator or a quartz crystal oscillator as an electronic device described in the above embodiments.

The cellular phone 700 shown in FIG. 8 is configured to use the above-described quartz crystal resonator (any of 1 to 3) or the above-described quartz crystal oscillator 5 as, for example, a timing device such as a reference clock oscillation source and further include a liquid crystal display device 701, multiple operation buttons 702, an earpiece 703, and a mouthpiece 704. The configuration of the cellular phone is not limited to the type shown in the drawing, and a configuration of a so-called smart phone type may also be adopted.

The application of the electronic device such as the above-described quartz crystal resonator is not limited to the above-described cellular phone, and the electronic device can be favorably used as a timing device of an electronic apparatus including an electronic book, a personal computer, a television, a digital still camera, a video camera, a video recorder, a navigation apparatus, a pager, an electronic organizer, a calculator, a word processor, a workstation, a videophone, a POS terminal, a game instrument, a medical apparatus (for example, an electronic thermometer, a blood pressure meter, a blood sugar meter, an electrocardiogram measuring instrument, an ultrasound diagnostic instrument, and an electronic endoscope), a fish finder, various measurement apparatuses, gauges, a flight simulator, and the like. In any case, the effects described in the above embodiments are exhibited, and thus, an electronic apparatus in which the size of a relevant component is reduced and the reliability is high can be provided.

Moving Object

Next, an automobile will be described as an example of a moving object including the above-described electronic device.

Figure 9:
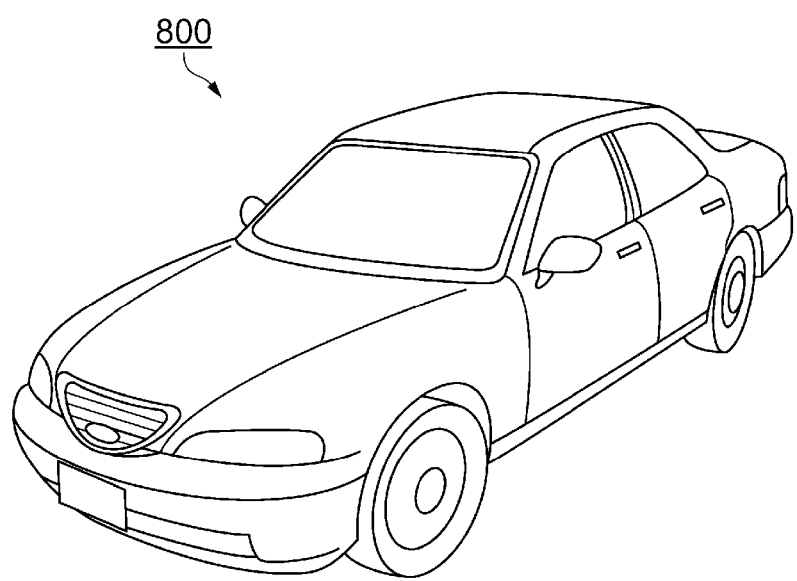
FIG. 9 is a schematic perspective view showing an automobile as a moving object.

FIG. 9 is a schematic perspective view showing an automobile as a moving object.

An automobile 800 includes a quartz crystal resonator or a quartz crystal oscillator as an electronic device described in the above embodiments.

The automobile 800 uses the above-described quartz crystal resonator (any of 1 to 3) or the above-described quartz crystal oscillator 5 as, for example, a timing device such as a reference clock oscillation source of various electronically controlled apparatuses (for example, an electronically controlled fuel injector, an electronically controlled ABS apparatus, an electronically controlled constant speed travelling apparatus, and the like) mounted therein.

According to this, since the automobile 800 includes the above-described quartz crystal resonator or quartz crystal oscillator, the effects described in the above embodiments are exhibited, and thus, for example, the size of the respective electronically controlled apparatuses is reduced, and high reliability and excellent performance can be exhibited.

The application of the electronic device such as the above-described quartz crystal resonator is not limited to the above-described automobile 800, and the electronic device can be favorably used as a timing device such as a reference clock oscillation source of a moving object including a self-propelled robot, a self-propelled conveying apparatus, a train, a ship, an airplane, a satellite, and the like. In any case, the effects described in the above embodiments are exhibited, and thus, a moving object in which the size of a relevant component is reduced and the reliability is high can be provided.

The shape of the quartz crystal resonator element of the quartz crystal resonator is not limited to a flat plate shape shown in the drawing and may be a shape in which a central portion is thick and a peripheral portion is thin (for example, a convex shape, a bevel shape, or a mesa shape), or a reverse shape in which a central portion is thin and a peripheral portion is thick (for example, a reverse mesa shape), or the like, and also may be a tuning folk shape.

The material of the resonator element is not limited to quartz crystal and may be a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or a semiconductor material such as silicon (Si).

The driving method for thickness shear vibration may be an electrostatic driving method employing a Coulomb's force other than a method employing a piezoelectric effect of a piezoelectric body.

The Ti—Ag—Cu-containing alloy of the bonding metal layer is not limited to an alloy containing only Ti, Ag, and Cu, and may contain, for example, a metal which does not belong to Group 6 in the periodic table such as Sn (tin).

The entire disclosure of Japanese Patent Application No. 2014-145667, filed Jul. 16, 2014 is expressly incorporated by reference herein.

What is claimed is:

1. A package base, comprising:
   a substrate containing a ceramic; and
   a bonding metal layer provided in a frame shape or a ring shape in plan view on the substrate, wherein
   the bonding metal layer contains a Ti—Ag—Cu-containing alloy and a metal belonging to Group 6 in the periodic table.

2. The package base according to claim 1, wherein the bonding metal layer contains Mo or W as the metal belonging to Group 6.

3. The package base according to claim 1, further comprising a metal coating film covering at least a part of the surface of the bonding metal layer.

4. The package base according to claim 3, wherein the metal coating film includes a Ni film and a Au film which are stacked in this order from the bonding metal layer side.

5. A package, comprising:
   a substrate containing a ceramic;
   a lid covering one side of the substrate; and
   a bonding metal layer provided in a frame shape or a ring shape in plan view and bonding the substrate and the lid to each other to form an internal space,
   wherein the bonding metal layer contains Ti, Ag, Cu, and a metal belonging to Group 6 in the periodic table that is either Mo or W, and
   in the bonding metal layer, when the amount of Ti, Ag, and Cu is represented by A wt % and the amount of Mo is represented by B wt %, the ratio of A to B satisfies the following relational formula: $65 \leq A \leq 75:35 \geq B \geq 25$ (provided that A+B=100).

6. The package according to claim 5, further comprising a metal coating film covering at least a part of the bonding metal layer.

7. The package according to claim 6, wherein the metal coating film includes a Ni film and a Au film which are stacked in this order from the bonding metal layer side.

8. The package according to claim 5, wherein the substrate has a recess on the lid side.

9. The package according to claim 5, wherein the lid has a recess on the substrate side.

10. An electronic device, comprising:
    the package according to claim 5; and
    an electronic component, wherein
    the electronic component is housed in the internal space of the package.

11. An electronic apparatus comprising the electronic device according to claim 10.

12. A moving object comprising the electronic device according to claim 10.

* * * * *